(12) United States Patent
Camillo-Castillo et al.

(10) Patent No.: US 10,170,553 B2
(45) Date of Patent: Jan. 1, 2019

(54) SHAPED TERMINALS FOR A BIPOLAR JUNCTION TRANSISTOR

(71) Applicant: GLOBALFOUNDRIES INC., Grand Cayman (KY)

(72) Inventors: Renata Camillo-Castillo, Portland, OR (US); Qizhi Liu, Lexington, MA (US); John J. Pekarik, Underhill, VT (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/626,241

(22) Filed: Jun. 19, 2017

(65) Prior Publication Data
US 2017/0288033 A1   Oct. 5, 2017

Related U.S. Application Data

(62) Division of application No. 14/747,385, filed on Jun. 23, 2015.

(51) Int. Cl.
| | |
|---|---|
| *H01L 29/423* | (2006.01) |
| *H01L 29/732* | (2006.01) |
| *H01L 21/306* | (2006.01) |
| *H01L 29/08* | (2006.01) |
| *H01L 29/66* | (2006.01) |
| *H01L 29/737* | (2006.01) |
| *H01L 29/06* | (2006.01) |
| *H01L 29/10* | (2006.01) |

(52) U.S. Cl.
CPC .... *H01L 29/0821* (2013.01); *H01L 21/30608* (2013.01); *H01L 29/0653* (2013.01); *H01L 29/0804* (2013.01); *H01L 29/1004* (2013.01); *H01L 29/66242* (2013.01); *H01L 29/7371* (2013.01); *H01L 29/66272* (2013.01)

(58) Field of Classification Search
CPC ............ H01L 29/0649; H01L 29/0821; H01L 29/0826; H01L 29/161; H01L 29/165; H01L 29/66242; H01L 29/66272; H01L 29/73; H01L 29/732; H01L 29/7371; H01L 29/7322; H01L 29/737; H01L 29/7378; H01L 29/7317
See application file for complete search history.

(56) References Cited

U.S. PATENT DOCUMENTS

| | | | |
|---|---|---|---|
| 3,892,606 A | | 7/1975 | Chappelow et al. |
| 4,718,973 A | * | 1/1988 | Abraham .......... H01L 21/32137 |
| | | | 257/E21.312 |

(Continued)

FOREIGN PATENT DOCUMENTS

| | | |
|---|---|---|
| EP | 0148448 A2 | 7/1985 |
| JP | H05067626 A | 3/1993 |

*Primary Examiner* — Mark Tornow
*Assistant Examiner* — Priya Rampersaud
(74) *Attorney, Agent, or Firm* — Thompson Hine LLP; Anthony Canale

(57) ABSTRACT

Device structure and fabrication methods for a bipolar junction transistor. An emitter layer is formed on a base layer and etched to form an emitter of the device structure. The emitter layer has a concentration of an element that varies as a function of the thickness of the emitter layer. The etch rate of the emitter layer varies as a function of the concentration of the element such that the emitter has a variable width over the thickness of the emitter layer.

12 Claims, 6 Drawing Sheets

(56) References Cited

U.S. PATENT DOCUMENTS

| | | | |
|---|---|---|---|
| 4,954,457 A | 9/1990 | Jambotkar | |
| 7,180,157 B2 | 2/2007 | Freeman et al. | |
| 7,579,252 B2 | 8/2009 | Goulakov | |
| 7,687,887 B1 | 3/2010 | El-Diwany et al. | |
| 2002/0105053 A1 | 8/2002 | Sato | |
| 2003/0096444 A1 | 5/2003 | Kraus | |
| 2006/0011943 A1* | 1/2006 | Howard | H01L 29/0649 257/197 |
| 2006/0060887 A1 | 3/2006 | Geiss et al. | |
| 2007/0235762 A1* | 10/2007 | Pagette | H01L 29/66318 257/198 |
| 2007/0298578 A1* | 12/2007 | Khater | H01L 29/66242 438/322 |
| 2013/0313677 A1* | 11/2013 | Qian | H01L 29/737 257/499 |

\* cited by examiner

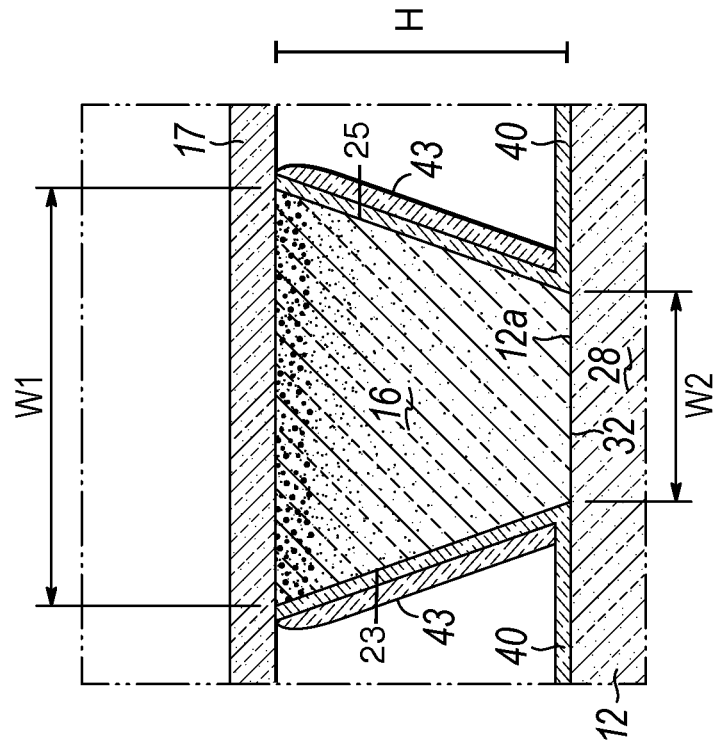
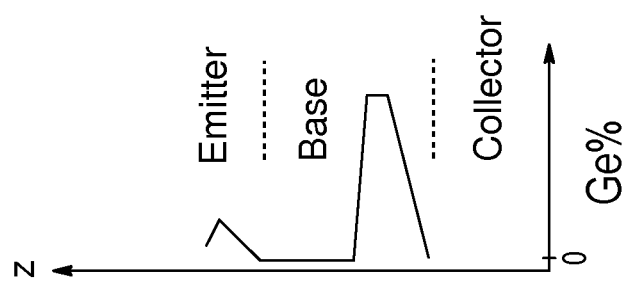
FIG. 3B
FIG. 3A

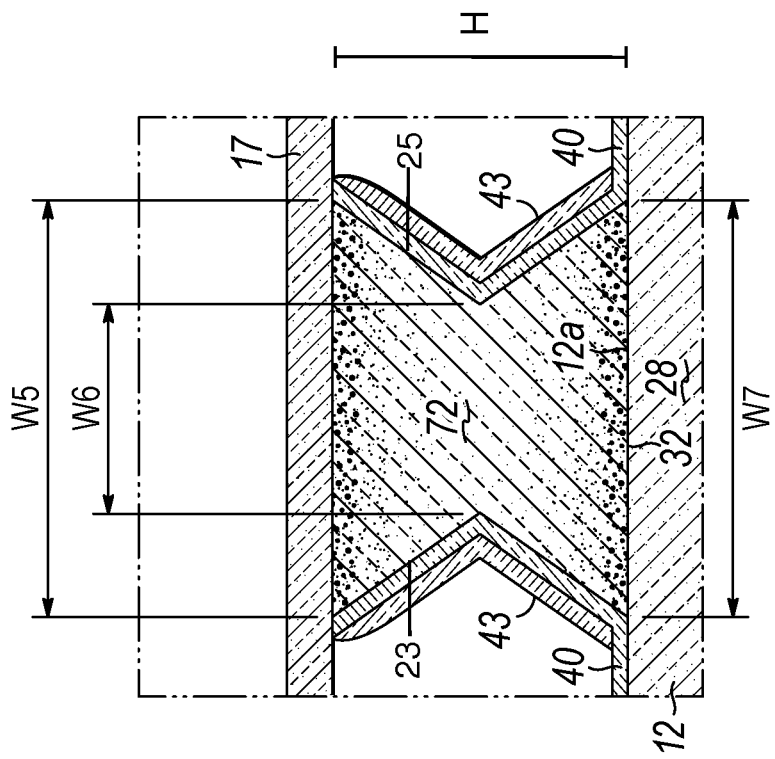
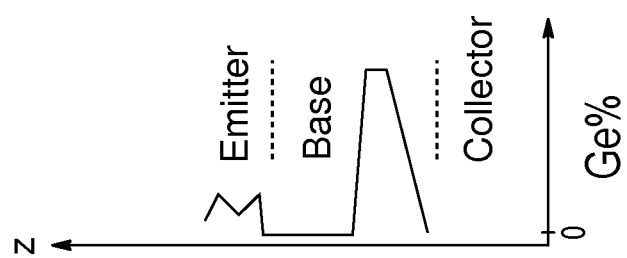
FIG. 6B
FIG. 6A

SHAPED TERMINALS FOR A BIPOLAR JUNCTION TRANSISTOR

BACKGROUND

The invention relates generally to semiconductor devices and integrated circuit fabrication and, in particular, to fabrication methods and device structures for a bipolar junction transistor.

Bipolar junction transistors may be found, among other end uses, in high-frequency and high-power applications. In particular, bipolar junction transistors may find specific end uses in amplifiers for wireless communications systems and mobile devices, switches, and oscillators. Bipolar junction transistors may also be used in high-speed logic circuits. Bipolar junction transistors are three-terminal electronic devices that include an emitter, an intrinsic base, and a collector defined by regions of different semiconductor materials. In the device structure, the intrinsic base situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased and the base-collector junction is reverse biased. The collector-emitter current may be controlled by the base-emitter voltage.

Improved fabrication methods and device structures are needed for a bipolar junction transistor.

SUMMARY

In an embodiment of the invention, a method is provided for fabricating a device structure. An emitter layer is formed on a base layer and etched to form an emitter of the device structure. The emitter layer has a concentration of an element that varies as a function of the thickness of the emitter layer. The etch rate of the emitter layer varies as a function of the concentration of the element such that the emitter has a variable width over the thickness of the emitter layer.

In an embodiment of the invention, a device structure is provided for a bipolar junction transistor. The device structure includes a base layer and an emitter on the base layer. The emitter has a height and a concentration of an element that varies as a function of the height. The emitter has a width that varies as a function of the height in relation to the concentration of the element.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 3A is a diagrammatic view of a germanium concentration profile in the base layer and the emitter layer.

FIG. 3B is an enlarged view of a portion of FIG. 2.

FIG. 6A is a diagrammatic view similar to FIG. 3A showing a germanium concentration profile in the base layer and the emitter layer in accordance with an alternative embodiment of the invention.

FIG. 6B is an enlarged view similar to FIG. 3B of an emitter in accordance with an alternative embodiment of the invention in which the emitter is formed using the emitter layer with the germanium concentration profile of FIG. 6A.

DETAILED DESCRIPTION

Figure 1:
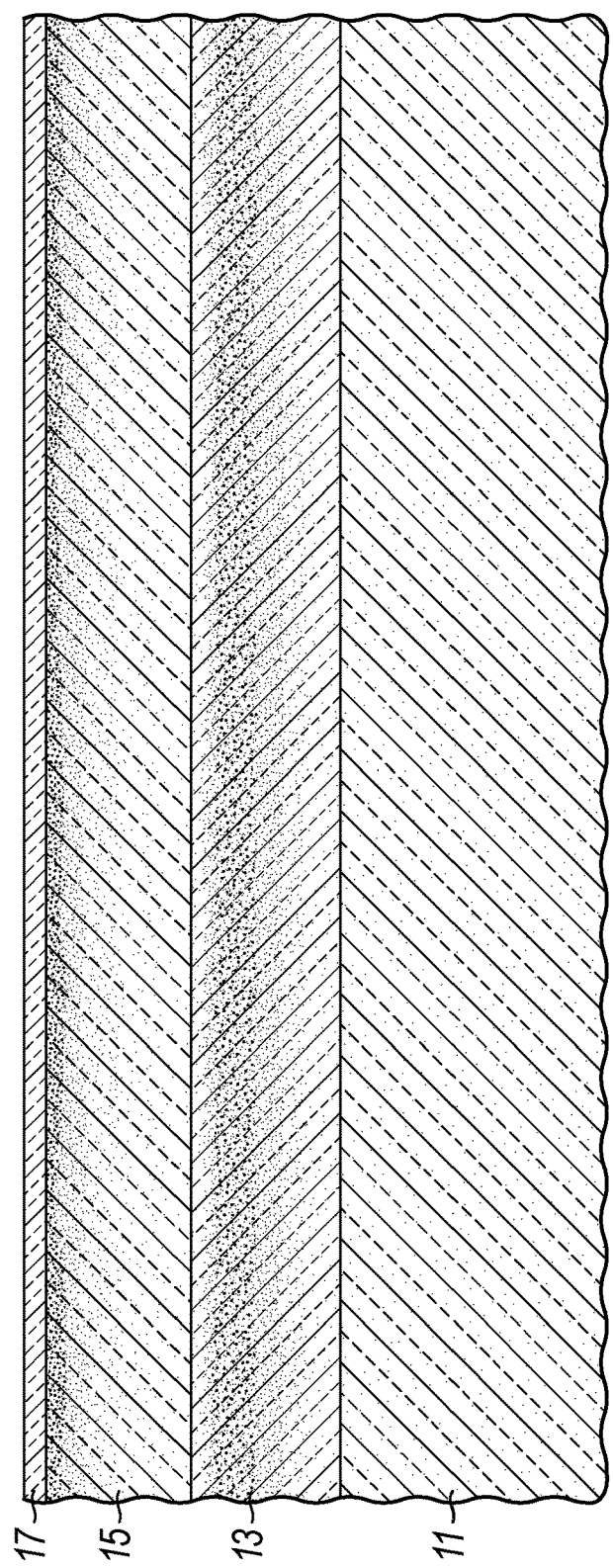
FIG. 1 is a cross-sectional view of a portion of a substrate at an initial fabrication stage of a processing method for fabricating a device structure in accordance with an embodiment of the invention.

With reference to FIG. 1 and in accordance with an embodiment of the invention, a substrate 11 used to form a device structure for a bipolar junction transistor comprises a single-crystal semiconductor material usable to form the devices of an integrated circuit. For example, the substrate 11 may be comprised of a wafer of a monocrystalline silicon-containing material, such as a single-crystal silicon wafer, or a device layer of a silicon-on-insulator wafer. The semiconductor material constituting the substrate 11 may comprise an electrically-active dopant that alters its electrical properties and may also include an optional epitaxial layer at its top surface 11a. The substrate 11 may comprise an n-type dopant from Group V of the Periodic Table (e.g., phosphorus (P), arsenic (As), or antimony (Sb)) in a concentration that is effective to impart n-type conductivity.

A layer stack including a base layer 13 and an emitter layer 15 is formed on the substrate 11. The base layer 13 is located on the top surface 11a of substrate 11, and the emitter layer 15 is located on a top surface of the base layer 13. The base layer 13 and emitter layer 15 may each include a germanium content and the germanium content of the emitter layer 15 may be tailored such that the sidewalls of the emitter subsequently formed from the emitter layer 15 can be shaped, when etched, to impart a shape to the emitter.

The base layer 13 may be comprised of a different semiconductor material than the collector 14 and may have an opposite conductivity type from the collector 14. The base layer 13 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 13 may be graded and/or stepped across the thickness of base layer 13. The semiconductor material of the base layer 13 may further comprise a dopant, such as a p-type dopant selected from Group III of the Periodic Table (e.g., boron) in a concentration that is effective to impart p-type conductivity and, optionally, carbon (C) to suppress the outdiffusion of the p-type dopant.

The base layer 13 may be formed using a low temperature epitaxial (LTE) growth process, such as vapor phase epitaxy (VPE) conducted at a growth temperature ranging from 400°

C. to 850° C. Single crystal semiconductor material (e.g., single crystal silicon and/or single crystal silicon germanium) is epitaxially grown or deposited by low temperature epitaxial growth on the top surface 11a of substrate 11. The base layer 13 may have an epitaxial relationship with the single crystal semiconductor material of the substrate 11 in which the crystal structure and orientation of the substrate 11 operates as a template to establish the crystal structure and orientation of the base layer 13 during growth.

The emitter layer 15 may be comprised of a semiconductor material, such as silicon-germanium (SiGe) including silicon (Si) and germanium (Ge) in a composition with a silicon content ranging from 95 atomic percent to 50 atomic percent and a germanium content ranging from 5 atomic percent to 50 atomic percent, or SiGe:C with a composition having up to 10 percent carbon. The emitter layer 15 may comprise a dopant, such as a p-type dopant selected from Group III of the Periodic Table (e.g., boron) in a concentration that is effective to impart p-type conductivity and, optionally, carbon (C) to suppress the outdiffusion of the p-type dopant. The semiconductor material of the emitter layer 15 may be formed by the same growth process used to deposit the base layer 13. Epitaxial growth is a process by which the single-crystal semiconductor material of the emitter layer 15 is deposited on the single-crystal semiconductor material of the base layer 13 and in which the crystallographic structure of the single-crystal material of the base layer 13 is reproduced in the semiconductor material of the emitter layer 15. During epitaxial growth, the semiconductor material constituting the emitter layer 15 will acquire the crystal orientation and crystal structure of single crystal semiconductor material of the base layer 13, which serves as a template for growth of the emitter layer 15.

As best shown in FIG. 3A, the base layer 13 and the emitter layer 15 each include a germanium concentration in their respective semiconductor compositions that varies as a function of vertical position (i.e., the z-direction in FIG. 3A) relative to the top surface 11a of the substrate 11. The horizontal dashed lines overlaid on the germanium concentration profile in FIG. 3A indicate the respective transitions in vertical position in the device structure 10 from the substrate 11 to the base layer 13 and from the base layer 13 to the emitter layer 15 for a device structure 10 in which the thickness of the base layer 13 is equal to three times the thickness of the emitter layer 15.

The germanium concentration in the base layer 13 varies over its thickness. In the representative embodiment, the germanium concentration in the base layer 13 may vary across the layer thickness. The germanium concentration increases initially with increasing distance from the substrate 11, plateaus at a peak concentration over the majority of its thickness, and then decreases with increasing distance from the substrate 11. The germanium concentration for vertical positions Z over the remainder of the thickness of the base layer 13 may be small negligible. Alternatively, the germanium concentration in the base layer 13 may have a graded or stepped appearance that differs from the representative trapezoidal appearance.

The emitter layer 15 is located above the base layer 13 with increasing vertical position in FIG. 3A relative to the top surface 11a of the substrate 11. The emitter layer 15 includes a concentration of germanium that varies with vertical position Z. In the representative concentration profile, the germanium concentration of the emitter layer 15 increases from a location near its bottom surface (i.e., the interface with the base layer 13) and reaches a peak concentration near its top surface. The decrease in the germanium concentration may be linear. The peak concentration of germanium in the emitter layer 15 is less than the peak concentration of germanium in the base layer 13. As discussed hereinbelow, the variation in the germanium concentration in the emitter layer 15 is employed to cause a variation in lateral etch rate with the result that the emitter formed from the emitter layer 15 has non-vertical (i.e., inclined) sidewalls.

In an alternative embodiment, the emitter layer 15 may include implantation damage to its constituent semiconductor material and/or implantation-doping of its semiconductor material that augment the varying germanium concentration to alter etch rate and, thereby, the profile for the sidewalls of the emitter. Similar to the germanium concentration profile, the damage or doping may be likewise non-uniform over the thickness of the emitter layer 15.

A hardmask layer 17 is located on a top surface of the emitter layer 15. The hardmask layer 17 is comprised of a material that etches selective to the material of the emitter layer 15. The hardmask layer 17 may be comprised of a dielectric material, such as silicon dioxide.

Figure 2:
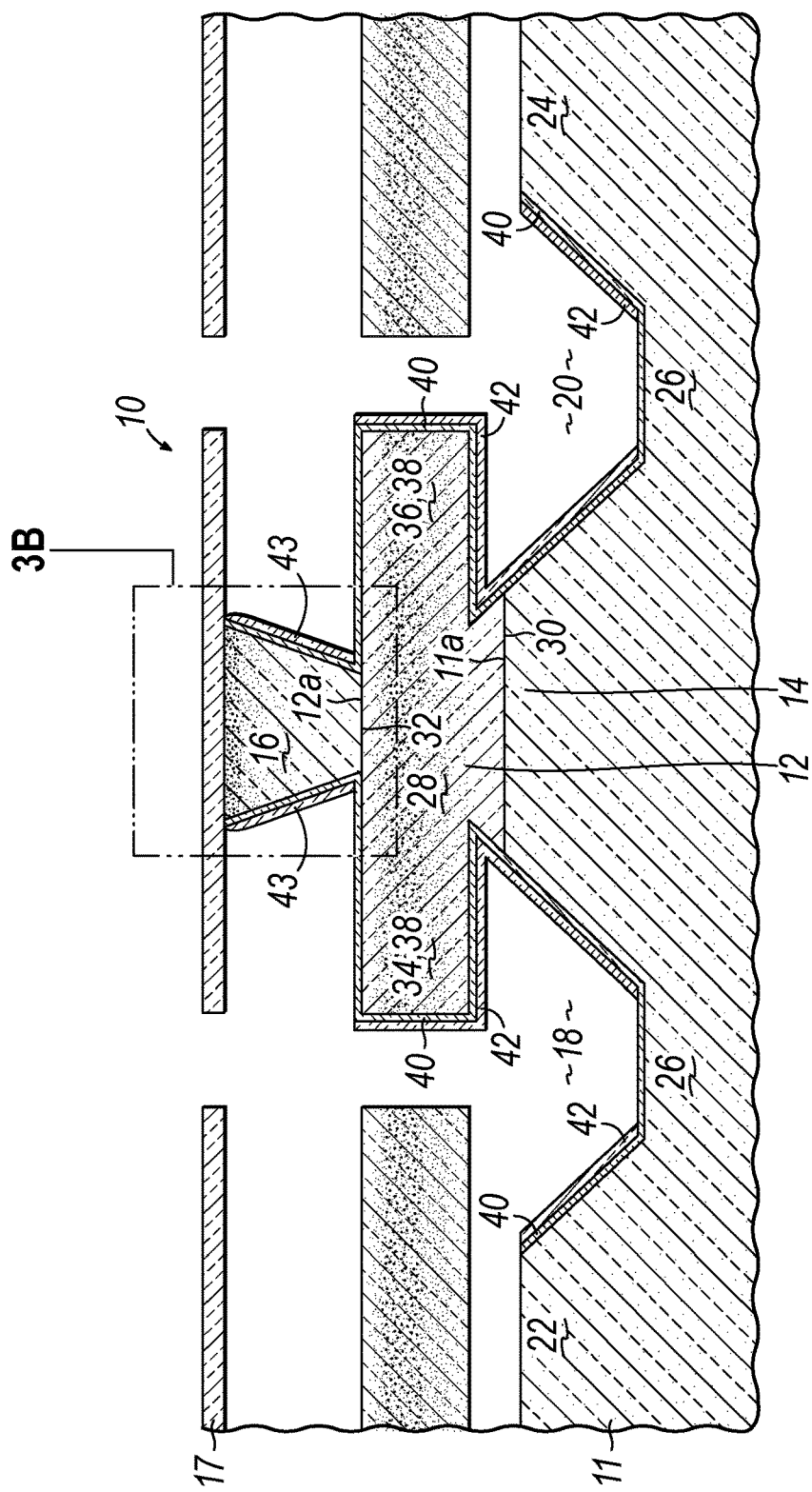
FIG. 2 is a cross-sectional view of the substrate portion of FIG. 1 at a subsequent fabrication stage of the processing method.

With reference to FIGS. 2, 3B in which like reference numerals refer to like features in FIG. 1 and at a subsequent fabrication stage of the processing method, a device structure 10 for a bipolar junction transistor is formed from the layers 13, 15 and the substrate 11 by etching trenches 18, 20 that extend to a shallow depth beneath the top surface 11a of the substrate 11. The trenches 18, 20 may be formed by a dry etching process (e.g., reactive-ion etching (RIE)), a wet chemical etching process, or a combination of wet and dry etching processes conducted in one or more steps using one or more etch chemistries. The trenches 18, 20 are formed in alignment with openings in the hardmask layer 17. A section of the base layer 12 is positioned between the trenches 18, 20 and includes an intrinsic base 28 of the device structure 10. A section of the emitter layer 15 is positioned between the trenches 18, 20 and defines an emitter 16 of the device structure 10. One of the etching processes causes the base layer 13 to be undercut so that the substrate 11 is replaced by cavities located beneath peripheral sections 34, 36 of the base layer 13. The trenches 18, 20 are subsequently used to form trench isolation regions filled with dielectric material.

The emitter layer 15 is also narrowed by the etching processes in that the emitter layer 15 is also undercut relative to the hardmask layer 17. Generally, the emitter layer 15 is narrowed to a greater extent than the base layer 13 due to the lower concentration of germanium in its constituent semiconductor material, which results in an increased etch rate so that the emitter layer 15 etches selective to (i.e., at a higher etch rate than) the base layer 13. An exemplary composition-sensitive etchant that etches the semiconductor material of emitter layer 15 with a higher etch rate than the semiconductor material of the base layer 13 is an ammonia hydroxide-based or a potassium hydroxide-based chemical etchant. At the conclusion of the etching processes, a section of the emitter layer 15 defining the emitter 16 is centrally located over the base layer 13.

The shape of the emitter 16 and the profile for its sidewalls 25, 27 result from the variation in germanium concentration over the thickness of the emitter layer 15 and the resulting composition-dependent etch rate that varies as a function of the germanium concentration over the height of the emitter 16. Due to the compositional-dependent etch rate, the emitter 16 is characterized by a width that varies as a function of height H (i.e., the thickness of the emitter layer 15) in coordination with the variation in germanium concentration. In the representative embodiment, the variation in the germanium concentration is linear over the height H of the emitter 16. In an alternative embodiment, the implantation damage and/or doping of the semiconductor material of the emitter layer 15 may be used to alter etch rates and determine, at least in part, the profile of the sidewalls 25, 27 and the shape of the emitter 16.

The emitter 16 includes sidewalls 25, 27 that are separated by a narrower width W1 at the top surface used to contact the emitter 16 and by wider width W2 at a bottom surface defining an interface with the base layer 13. Width W1 is greater than width W2 such that the width narrows over the height H of the emitter 16 in a direction from the top surface of the emitter 16 toward the interface with the intrinsic base 28. Due to the linear variation in the germanium concentration in the representative embodiment, the width of the emitter 16 linearly varies over the height H from width W1 to width W2 to produce the trapezoidal shape.

The collector 14 may be comprised of a section of the material of the substrate 11 located between the trenches 18, 20 and may contain a concentration of an n-type dopant in a concentration that is effective to impart n-type conductivity. The dopant concentration of the collector 14 may be elevated to enhance its electrical conductivity by ion implantation or the growth of a doped epitaxial layer at the top surface 11a of the substrate 11. The collector contacts 22, 24 are separated laterally from the collector 14 by the trenches 18, 20. A sub-collector 26 extends laterally from the collector 14 beneath the trenches 18, 20 to couple the collector 14 with the collector contacts 22, 24. The collector contacts 22, 24 and sub-collector 26 are also comprised of the semiconductor material of the substrate 11 and have the same conductivity type as the semiconductor material comprising the collector 14.

The device structure 10, which is characterized by a vertical architecture, includes the emitter 16, the collector 14, and the intrinsic base 28 positioned between the emitter 16 and collector 14. The intrinsic base 28 is coextensive with the collector 14 along an interface or junction 30, and the emitter 16 is coextensive with the intrinsic base 28 along another interface or junction 32. Sections 34, 36 of the base layer 13, which are peripheral to the intrinsic base 28, may collectively define an extrinsic base 38 that is coupled with the intrinsic base 28. In the representative device structure, the sections 34, 36 of the base layer 13 defining the extrinsic base 38 at least partially overhang the trenches 18, 20 and the trench isolation regions subsequently formed in the trenches 18, 20. The device structure 10 may be characterized as a heterojunction bipolar transistor (HBT) if two or all three of the collector 14, the emitter 16, and the intrinsic base 28 are comprised of semiconductor materials with different bandgaps.

A dielectric layer 40 is located on the exposed surfaces of the base layer 13, the emitter 16, and the substrate 11, and a dielectric layer 42 is located on the dielectric layer 40. The dielectric layers 40, 42 may be comprised of different electrical insulator characterized by a dielectric constant (e.g., a permittivity) characteristic of a dielectric material. In one embodiment, the dielectric layer 40 may be comprised of silicon dioxide ($SiO_2$) deposited using a rapid thermal process or formed by thermal oxidation, and dielectric layer 42 may be comprised of an electrical insulator, such as silicon nitride ($Si_3N_4$), that is conformally deposited by chemical vapor deposition. A directional anisotropic etching process, such as RIE, is used to preferentially remove the dielectric layer 42 from horizontal surfaces, such as the top surface 12a of the base layer 13, and partially horizontal surfaces, such as the inclined surfaces inside the trenches 18, 20. Spacers 43 are formed from the dielectric layers 40, 42 on the sidewalls 23, 25 of the emitter 16 by the preferential removal of the dielectric layer 42.

Figure 4:
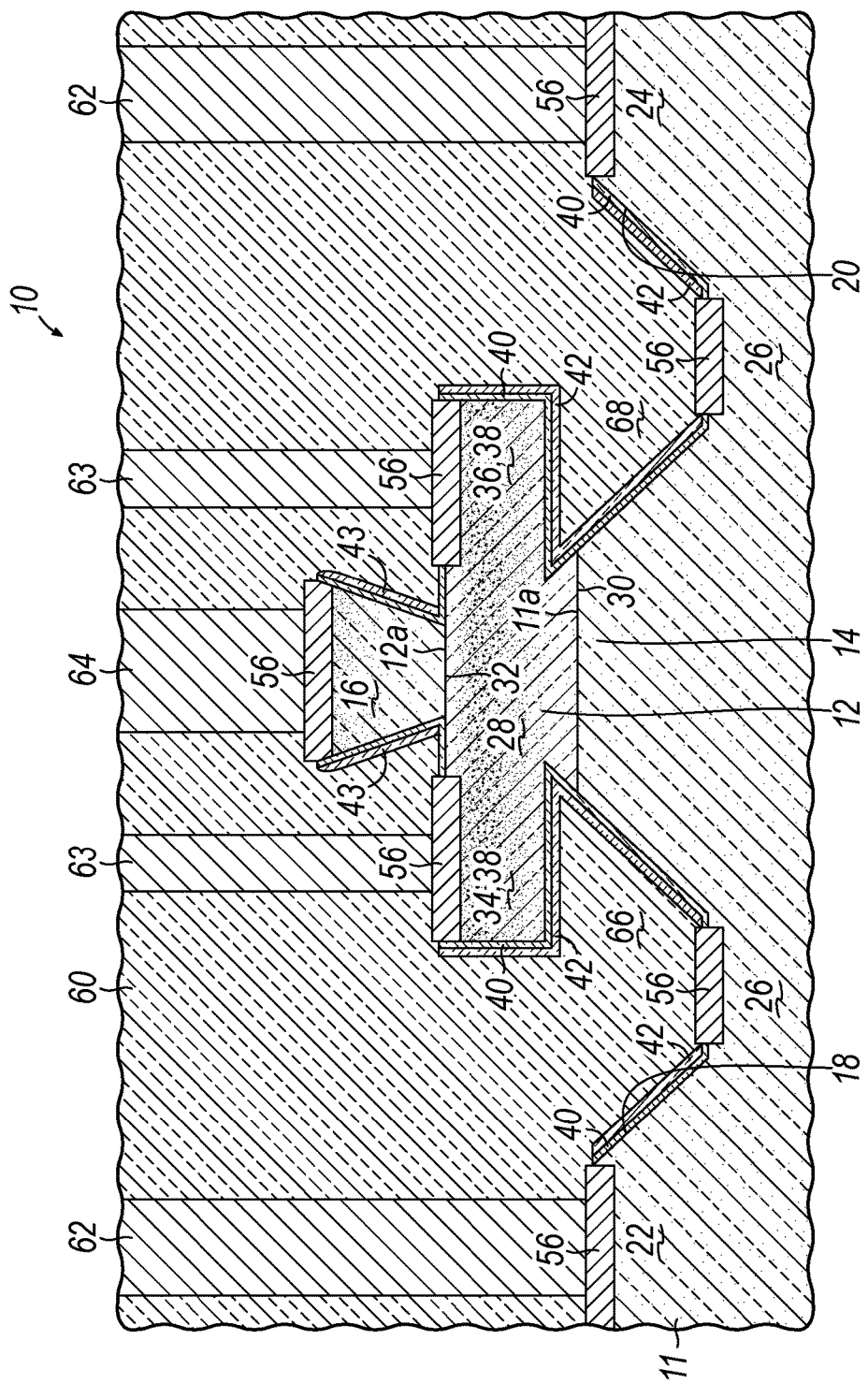
FIG. 4 is a cross-sectional view of the substrate portion of FIG. 2 at a subsequent fabrication stage of the processing method.

With reference to FIG. 4 in which like reference numerals refer to like features in FIG. 2 and at a subsequent fabrication stage of the processing method, the sections 34, 36 of base layer 13 defining the extrinsic base 38 are not covered by the emitter 16 and the spacers 43, and project laterally from the intrinsic base 28 that is covered by the emitter 16 and the spacers 43. These sections 34, 36, which are used to contact the covered intrinsic base 28, may be modified by ion implantation to increase their electrical conductivity.

The dielectric layer 40 is removed from the horizontal surfaces to expose the top surface of the emitter 16, the top surfaces of the collector contacts 22, 24, and the top surface of sections 34, 36 of the base layer 13. A silicide layer 56 is formed on these top surfaces and may be subsequently used in the process flow to contact the extrinsic base 38, collector contacts 22, 24, and the emitter 16.

Middle-of-line (MOL) processing, which includes formation of a dielectric layer 60, contacts 62, 63, 64, and wiring, follows to define a local interconnect structure. Contacts 62 are coupled with the collector contacts 22, 24, contacts 63 are coupled with the extrinsic base 38, and contacts 64 are coupled with the emitter 16. Candidate inorganic dielectric materials for the dielectric layer 60 may include, but are not limited to, borophosphosilicate glass (BPSG), silicon dioxide ($SiO_2$), silicon nitride ($Si_3N_4$), fluorine-doped silicon glass (FSG), and combinations of these and other dielectric materials. Dielectric layer 60 may be deposited by any number of techniques including, but not limited to, sputtering, spin-on application, or CVD. Portions of the dielectric layer 60 may at least partially fill the trenches 18, 20 to define trench isolation regions 66, 68 that laterally flank the collector 14.

Back-end-of-line (BEOL) processing follows, which includes formation of additional dielectric layers, via plugs, and wiring for an interconnect structure coupled by the local interconnect structure with the device structure 10, as well as other similar contacts for additional device structures like device structure 10 and CMOS transistors that may be included in other circuitry fabricated on the substrate 11.

Figure 5B:
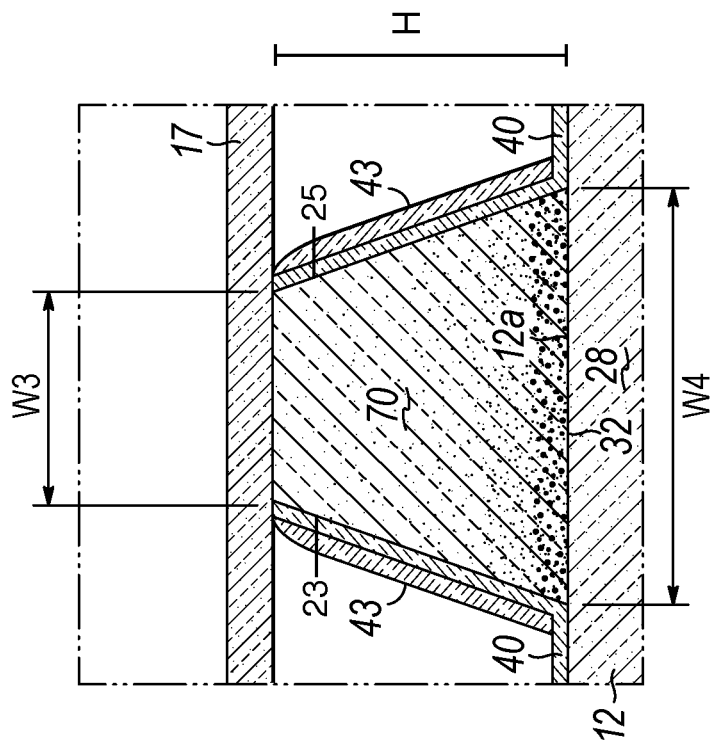
FIG. 5B is an enlarged view similar to FIG. 3B of an emitter in accordance with an alternative embodiment of the invention in which the emitter is formed using the emitter layer with the germanium concentration profile of FIG. 5A.
Figure 5A:
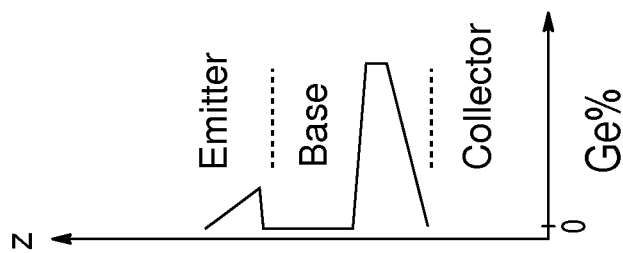
FIG. 5A is a diagrammatic view similar to FIG. 3A showing a germanium concentration profile in the base layer and the emitter layer in accordance with an alternative embodiment of the invention.

With reference to FIGS. 5A, 5B in which like reference numerals refer to like features in FIGS. 2, 3B and in accordance with an alternative embodiment of the invention, an emitter 70 has a different shape than emitter 16. Specifically, the emitter 70 has a trapezoidal shape that is inverted relative to the trapezoidal shape of emitter 16.

The emitter 70 (and the emitter layer 15 used to form the emitter 70) includes a concentration of germanium that varies with vertical position Z. In the representative profile, the germanium concentration of the emitter 70 reaches a peak concentration at a location near its bottom surface and decreases with vertical position Z from the peak concentration to lesser concentration in a direction toward its top surface. The decrease in germanium concentration may be linear. The shape of the emitter 70 results from the variation in germanium concentration over the thickness of the emitter layer 15 and the resulting composition-dependent etch rate that varies as a function of the germanium concentration. Due to the compositional-dependent etch rate, the emitter 70 is characterized by a width that varies as a function of height H (i.e., the thickness of the emitter layer 15) in coordination with the variation in germanium concentration. In the representative embodiment, the variation in the germanium concentration is linear over the height H of the emitter 70.

Due to the compositional-based variation in the etch rate, the emitter 70 is characterized by a width that varies as a function of height H over the thickness of the emitter layer 15. Specifically, the sidewalls 23, 25 of the emitter 70 are inclined at an angle relative to a surface normal of the substrate 11 such that the emitter 70 tapers from a larger width to a smaller width with increasing distance from the intrinsic base 28. The sidewalls 25, 27 of the emitter 16 are separated by a width W3 at the top surface used to contact the emitter 70 and by a width W4 at a bottom surface defining an interface with the intrinsic base 28. Width W4 is greater than width W3 such that the emitter 70 has a trapezoidal shape that narrows in a direction from its top surface toward its bottom surface. Due to the linear variation in the germanium concentration in the representative embodiment, the width of the emitter 70 linearly varies over the height H from width W3 to width W4 to produce the inverted trapezoidal shape.

With reference to FIGS. 6A, 6B in which like reference numerals refer to like features in FIGS. 2, 3B and in accordance with an alternative embodiment of the invention, an emitter 72 has a different shape than emitter 16 or emitter 70. Specifically, the emitter 72 has a bi-tapered shape that necks down from maximum widths W5 at the top surface and W7 at the bottom surface to a minimum width W6 at a location between the top and bottom surfaces (e.g., equidistant in the representative embodiment from the location between the top and bottom surfaces). The emitter 72 comprises abutting trapezoids that taper from larger widths W5, W7 to a smaller width W6.

The emitter 72 (and the emitter layer 15 used to form the emitter 72) includes a concentration of germanium that varies with vertical position Z. In the representative profile, the germanium concentration of the emitter 72 decreases from a peak concentration at a location near its bottom surface, decreases from peak concentration at a location near its top surface, and reaches a minimum concentration at location between the top and bottom surfaces. The decrease in germanium concentration may be linear. The shape of the emitter 72 results from the variation in germanium concentration over the thickness of the emitter layer 15 and the resulting composition-dependent etch rate that varies as a function of the germanium concentration. Due to the compositional-dependent etch rate, the emitter 72 is characterized by a width that varies as a function of height H (i.e., the thickness of the emitter layer 15) in coordination with the variation in germanium concentration. In the representative embodiment, the germanium concentration over the height H of the emitter 72 decreases linearly from the peak concentration at the top surface toward a minimum concentration between the top and bottom surfaces and decreases from the peak concentration the bottom surface toward the minimum concentration between the top and bottom surfaces.

Due to the compositional-based variation in the etch rate, the emitter 72 is characterized by a width that varies as a function of height H over the thickness of the emitter layer 15. Specifically, the emitter 72 tapers from a wider width W5 at each of its top and bottom surfaces to a narrower width W6 between the top and bottom surfaces. Width W4 is greater than width W3 such that the emitter 72 has a trapezoidal shape that narrows in a direction from its top surface toward its bottom surface. Due to the linear variation in the germanium concentration in the representative embodiment, the width of the emitter 72 linearly varies over the height H from width W5 to width W6 over each of its abutting trapezoidal shapes.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
    epitaxially growing a base layer;
    epitaxially growing an emitter layer with a thickness on the base layer;
    forming a hardmask layer over a section of the emitter layer; and
    etching, by a plurality of etching processes with the hardmask layer over the section of the emitter layer, a plurality of trenches extending through the emitter layer to define an emitter of the device structure,
    wherein the emitter layer has a concentration of an element that varies as a function of the thickness of the emitter layer, the section of the emitter layer is laterally etched by the etching processes such that the section of the emitter layer is undercut relative to the hardmask layer, and the emitter has a variable width over the thickness of the emitter layer due to a lateral etch rate that varies as a function of the concentration of the element during the plurality of etching processes.

2. The method of claim 1 wherein the concentration of the element increases with increasing distance from an interface between the emitter layer and the base layer.

3. The method of claim 2 wherein the concentration of the element increases linearly with the increasing distance.

4. The method of claim 1 wherein the concentration of the element decreases with increasing distance from an interface between the emitter layer and the base layer.

5. The method of claim 4 wherein the concentration of the element decreases linearly with the increasing distance.

6. The method of claim 1 wherein the element is germanium, and the emitter layer is comprised of silicon-germanium.

7. The method of claim 1 comprising:
etching the base layer to form an intrinsic base of the device structure.

8. The method of claim 7 wherein the base layer is formed on a substrate, and the plurality of trenches extend through the base layer and bound a collector of the device structure.

9. The method of claim 8 wherein the base layer is laterally etched to form the intrinsic base.

10. The method of claim 9 wherein the emitter layer has a first peak concentration of the element that is less than a second peak concentration of the element in the base layer such that a first lateral etch rate of the emitter layer is greater than a second lateral etch rate of the base layer.

11. The method of claim 10 wherein the element is germanium.

12. The method of claim 1 wherein the element is germanium.

* * * * *